(12) United States Patent
Yang et al.

(10) Patent No.: US 6,657,497 B1
(45) Date of Patent: Dec. 2, 2003

(54) ASYMMETRIC, VOLTAGE OPTIMIZED, WIDEBAND COMMON-GATE BI-DIRECTIONAL MMIC AMPLIFIER

(75) Inventors: Jeffrey M. Yang, Long Beach, CA (US); Yun-Ho Chung, Redondo Beach, CA (US); Matt Y. Nishimoto, Torrance, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/160,140

(22) Filed: May 30, 2002

(51) Int. Cl.[7] .................................................. H03F 3/16
(52) U.S. Cl. ...................... 330/277; 330/302; 330/295; 455/78
(58) Field of Search ................................ 330/277, 302, 330/284, 285, 84, 295, 124 R, 310, 311; 455/78

(56) References Cited

U.S. PATENT DOCUMENTS

| | | | | |
|---|---|---|---|---|
| 5,057,791 A | * | 10/1991 | Thompson et al. | 330/277 |
| 5,815,308 A | * | 9/1998 | Kim et al. | 359/341 |
| 5,821,813 A | | 10/1998 | Batchelor et al. | |

OTHER PUBLICATIONS

Archer, John W.; Sevimli, Oya; and Batchelor, Robert A.;"Bi–Directional Amplifiers for Half–Duplex Transceivers"; Csiro Telecommunications and Industrial Physics; Jul. 1999 IEEE pps. 251–254.

* cited by examiner

*Primary Examiner*—Henry Choe
(74) *Attorney, Agent, or Firm*—John A. Miller, Esq.; Warn, Burgess & Hoffman, P.C.

(57) ABSTRACT

A bi-directional amplifier (10) for a transceiver module for amplifying both transmit signals and receive signals propagating in opposite directions. The amplifier (10) includes first and second common gate FETs (22, 24) electrically coupled along a common transmission line (20). A first variable matching network (28) is electrically coupled to the transmission line (20) between a transmit signal input port (12) and the first FET (22), and a second variable matching network (30) is electrically coupled to the transmission line (20) between a receive signal input port (14) and the second FET (24). An interstage variable matching network (32) is electrically coupled to the transmission line (20) between the first and second FETs (22, 24). A DC voltage regulator (34) provides a DC bias signal to the matching networks (28, 30, 32) and the FETs (22, 24) so that different signal amplifications and different impedance matching characteristics can be provided for the transmit signal and the receive signal.

23 Claims, 1 Drawing Sheet

ASYMMETRIC, VOLTAGE OPTIMIZED, WIDEBAND COMMON-GATE BI-DIRECTIONAL MMIC AMPLIFIER

BACKGROUND OF THE INVENTION

1. Field of the Invention

This invention relates generally to a bi-directional amplifier and, more particularly, to an asymmetric, voltage optimized, wideband common-gate bi-directional amplifier for a transceiver, where the amplifier is optimized for both low noise amplification and high power amplification.

2. Discussion of the Related Art

Spacecraft-based surveillance and communications systems, such as satellite based radar systems, generally employ phased antenna arrays that require large apertures, on the order of 100 square meters or greater, to achieve the high spatial resolution necessary to support various communications protocols, such as GMTI, AMTI and SAR, known to those skilled in the art. Current technology and design approaches that support this large of a space-based phased array are generally impractical and expensive. For example, a phased antenna array operating at X-band (6–12 GHz) having a square aperture with side dimensions of ten meters, and taking into account the mutual coupling between adjacent radiation elements, can include up to 300,000 circuit elements. A typical spacecraft allocation of 20 kW of power and 10,000 pounds of payload would require each circuit element to consume no more than 50–100 mW of DC power and weigh less this 10–20 grams. Hence, the power and weight requirements are severe at the component level.

Each channel of a phased antenna array for these types of applications typically employs a transceiver module that processes both the signals received by the system and the signals transmitted by the system at different frequency bands. Each transceiver module generally has two separate signal amplification paths, one including a high power amplifier (HPA) for the transmit signal and one including a low noise amplifier (LNA) for the receive signal. The LNA typically has higher gain than the HPA because the receive signal has a very low intensity that is close to the noise floor. Four separate monolithic millimeter integrated chips (MMIC) are generally required to accommodate the amplification paths in each channel, one for the LNA, one for the HPA, and two for routing switches to switch the signal path between the transmit signal and the receive signal. The routing switches may be relays for low frequency applications or semiconductor switches, such as high electron mobility transistors (HEMT) or heterojunction bipolar transistors (HBT), for high frequency applications.

In a volume production environment, the high part count of the phased array complicates the manufacturing process and usually leads to undesired module rework. Further, the signal routing switches in the RF path incur losses that degrade the output power and the noise figure of the system affecting its performance. For example, the routing switch in front of the LNA may cause the noise to grow, which may not allow the system to detect the receive signal above the noise. Switch losses of this type may be on the order of 1–1.5 dB.

It is desirable to minimize the number of parts in a transceiver module, especially in spacecraft-based applications. To attain this goal, it has heretofore been known in the art to employ bi-directional amplifiers in each channel of a transceiver module, where the bi-directional amplifier amplifies both the transmit signals and the receive signals propagating in opposite directions. Because a bi-directional amplifier is used in this application, the routing switches normally required to route the receive signal to the LNA and the transmit signal to the HPA can be eliminated.

U.S. Pat. No. 5,821,813 issued to Batchelor et al. Oct. 13, 1998 discloses a bi-directional amplifier for this purpose. The '813 bi-directional amplifier employs a field effect transistor that is connected in a common gate mode with the common terminal of each port of the amplifier and with the gate of the transistor. The source and drain terminals of the transistor are connected to a corresponding one of the ports through an impedance matching device. However, the '813 bi-directional amplifier provides the same level of signal gain for the transmit signal and the receive signal. Thus, this bi-directional amplifier is not separately optimized for the transmit signals and the receive signals, and thus does not provide the best performance.

SUMMARY OF THE INVENTION

In accordance with the teachings of the present invention, a bi-directional amplifier is disclosed that has particular application for use in a transceiver module for amplifying both transmit signals and receive signals propagating in opposite directions. The amplifier includes first and second common gate field effect transistors (FETs) electrically coupled along a common transmission line. A first variable matching network is electrically coupled to the transmission line between a transmit signal input port and the first FET, and a second variable matching network is electrically coupled to the transmission line between a receive signal input port and the second FET. An interstage variable matching network is electrically coupled to the transmission line between the first and second FETs. A DC voltage regulator provides a DC bias signal to the matching networks and the FETs so that different signal amplifications and different impedance matching characteristics can be provided for the transmit signal and the receive signal.

Additional objects, advantages and features of the present invention will become apparent from the following description and appended claims, taken in conjunction with the accompanying drawings.

DETAILED DESCRIPTION OF THE EMBODIMENTS

The following discussion of the embodiments of the invention directed to a bi-directional amplifier is merely exemplary in nature, and is in no way intended to limit the invention or its applications or uses. For example, the bi-directional amplifier of the invention is described for use in a transceiver module. However, as will be appreciated by those skilled in the art, the bi-directional amplifier of the invention may have application in other circuits and systems for amplifying signals propagating in opposite directions.

Figure 1:
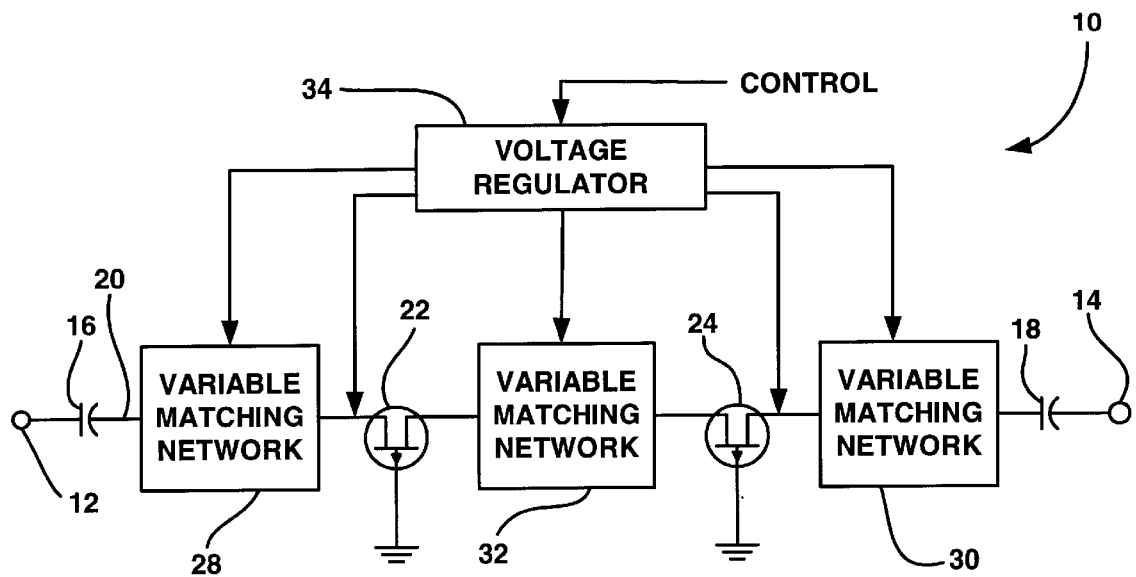
FIG. 1 is a schematic block diagram of a bi-directional amplifier for a transceiver, according to an embodiment of the present invention.

FIG. 1 is a schematic block diagram of a bi-directional amplifier 10, according to an embodiment of the present invention, that has an application for use in a transceiver module. The various components of the amplifier 10 discussed below are all patterned and defined on a common MMIC. The transceiver module can be employed in each channel of a phased array antenna on a satellite used for radar applications. The bi-directional amplifier 10 provides suitable amplification and signal gain to a transmit signal applied to an input port 12 at one end of the amplifier 10 and a receive signal applied to an input port 14 at an opposite end of the amplifier 10. As would be appreciated by those skilled in the art, the ports 12 and 14 would be electrically coupled to suitable external digital processing circuitry (not shown). Since mode of operation for amplifier 10 is controlled via variation in DC bias voltages, a DC blocking capacitor 16 is implemented to isolate external circuits that are connected to input port 12. DC blocking capacitor 18 next to the output port 14 is implemented for the same reason.

The bi-directional amplifier 10 includes a first field effect transistor (FET) 22 and a second FET 24 coupled to a transmission line 20 for amplifying the receive signals and transmit signals. In one embodiment, the transmission line 20 is a microstrip patterned on a substrate to have a width suitable for the various RF and DC bias signals discussed herein. The FETs 22 and 24 are common gate FETs, where the gate terminals are coupled to an RF ground. In an alternate embodiment, the FETs 22 and 24 can be other suitable amplifying devices, such as HEMTs. Two amplifying stages are employed to provide the desired noise figure and gain for the amplifier 10, as would be well understood with those skilled in the art.

As will be discussed in more detail below, the amplifying characteristics of the FETs 22 and 24 are changed between the transmit mode and the receive mode by providing a different drain/source DC bias ($V_{DS}$) for the transmit mode and the receive mode. When the amplifier 10 is in the transmit mode and is amplifying the transmit signal, the FET 22 acts as a high gain stage to provide most of the amplification of the transmit signal, and the FET 24 acts as a power stage to achieve the required high power transmit signal. When the amplifier 10 is in the receive mode and is amplifying the receive signal, the FET 24 acts a low noise stage followed by the. FET 22 which act as a gain stage. A DC voltage regulator 34 selectively provides the different $V_{DS}$ bias signals to the FETs 22 and 24 for the transmit mode and the receive mode.

One of the source terminal or the drain terminal of the FET 22 is coupled to the input port 12 through a variable external matching network 28, and one of the source terminal or the drain terminal of the FET 24 is electrically coupled to the input port 14 through a variable external matching network 30. The other of the source terminal or the drain terminal of the FET 22 is coupled to the other of the source terminal or the drain terminal of the FET 24 through a variable interstage matching network 32. As will be discussed in more detail below, the voltage regulator 34 selectively provides different DC bias voltages to the matching networks 28, 30 and 32 to allow them to be optimized for the desired impedance matching for both the transmit mode and the receive mode.

In the transmit mode, the variable matching network 28 matches the impedance of the transmitter circuitry coupled to the input port 12, such as 50 ohms, to the low impedance of the input at the source terminal of the FET 22. The variable matching network 32 matches the high impedance of the output at the drain terminal of the FET 22 to the low impedance at the input of the source terminal of the FET 24. The variable matching network 30 matches the high impedance of the output at the drain terminal of the FET 28 to the impedance of the transmitter circuitry coupled to the port 14.

In the receive mode, the variable matching network 30 matches the impedance of the receiver circuitry coupled to the input port 14, such as 50 ohms, to the low impedance of the input at the source terminal of the FET 24. The variable matching network 32 matches the high impedance of the output at the drain terminal of the FET 24 to the low impedance of the input at the source terminal of the FET 22. The variable matching network 28 matches the high impedance of the output at the drain terminal of the FET 22 to the impedance of the receiver circuitry coupled to the port 12.

In one embodiment, the voltage regulator 34 provides a set of DC bias signals to the FETs 22 and 24 and the matching networks 28, 30 and 32 when the amplifier 10 is in the transmit mode. The polarity and level of the DC bias signals to the FETs 22 and 24 and the matching networks 28, 30 and 32 are reversed and varied when the amplifier 10 is in the receive mode. The difference in polarity and level of bias signal voltages makes the amplifier 10 asymmetric. The polarity reversal of the bias signals causes the source terminal and the drain terminal of the FETs 22 and 24 to alternate for the transmit mode and the receive mode and thus change the directional of amplification. The voltage regulator 34 can be any voltage regulator design suitable for the purposes described herein. In this embodiment, the voltage regulator 34 converts a transistor-transistor logic (TTL) control signal to the required DC bias signals. Particularly, for a high TTL signal, the voltage regulator 34 provides the high level positive DC bias voltage for the transmit mode, and for a low TTL signal the voltage regulator 34 provides the low level negative DC bias voltage for the receive mode.

In one embodiment, the amplifier 10 is patterned on a single MMIC that is about 4 mm². The transmission line 20 is a microstrip transmission line having suitable width and thickness for RF signals. DC bias lines are also microstrips having a suitable thickness and width for DC signals. In a particular transceiver module application in a phase array antenna, the amplifier 10 is positioned after the phase shifters in each channel to minimize excessive loss which may degrade transmit power output and receive noise figure. The amplifier 10 provides an asymmetric match to insure maximum power output in the transmit direction while enhancing low noise performance in the receive direction. The changing DC bias signal is varied to enhance amplifier performance, i.e., high voltage for power in the transmit mode, and low voltage for low noise operations in the receive mode.

Figure 2:
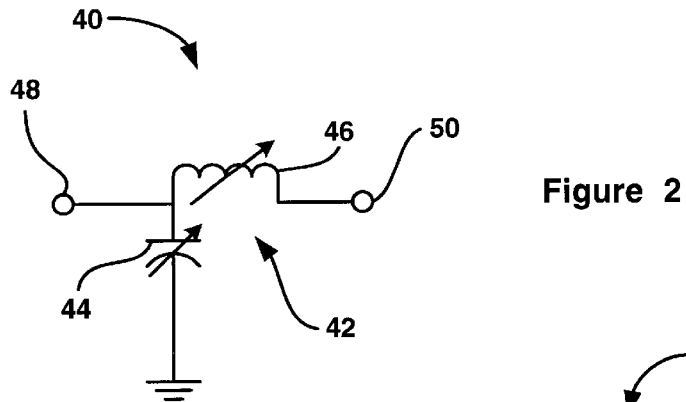
FIG. 2 is a schematic diagram of a variable matching network, including a tunable capacitor and inductor network, for the bi-directional amplifier shown in FIG. 1, according to an embodiment of the present invention.

The variable matching networks 28, 30 and 32 can be any suitable matching network for the purposes described herein, as long as they are variable to switch between the transmit mode and the receive mode. FIG. 2 is a schematic diagram of a matching network 40 that can be used for any or all of the matching networks 28, 30 and 32. The matching network 40 includes an LC circuit 42 having a tunable capacitor 44 and a tunable inductor 46 electrically coupled together as shown. The RF transmit signal or the RF receive signal is applied to one of the network ports 48 or 50 in the matching network 40, depending on its orientation in the amplifier 10. The DC bias signal from the voltage regulator 34 controls the capacitance of the capacitor 44 and the inductance of the inductor 46 so that they can be changed for the transmit mode and the receive mode as discussed above.

The variable capacitor 44 and the variable inductor 46 can be any suitable device for the purposes described herein. In one embodiment, the capacitor 44 includes a piezoelectric substrate provided between the capacitor plates whose thickness changes when different voltage potentials are applied thereto, which changes the capacitance of the capacitor 44. Likewise, the inductor 46 can be an element wound through a piezoelectric material, where a voltage potential applied to the piezoelectric material causes it to expand or contract, changing the mutual inductance of the inductor 46.

Figure 3:
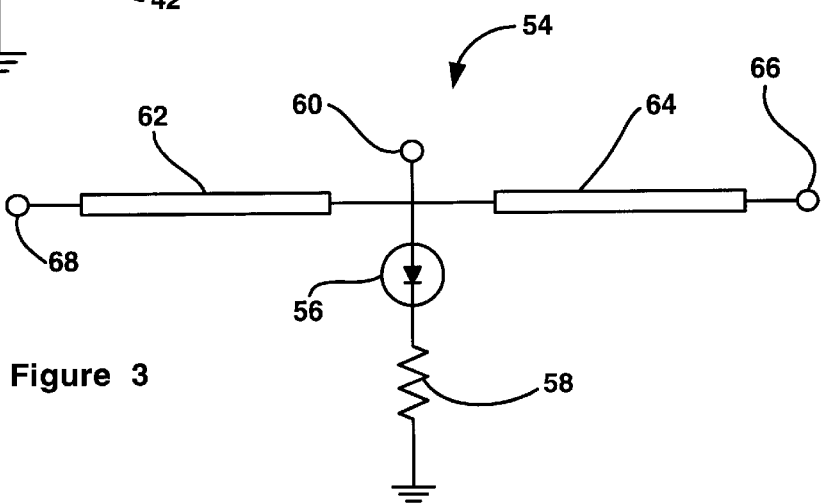
FIG. 3 is a schematic diagram of a variable matching network including a quarter-wave transform and diode coupled to ground for the bi-directional amplifier shown in FIG. 1, according to another embodiment of the present invention.

FIG. 3 is a schematic diagram of a matching network 54 that also has application for the matching networks 28, 30 and 32 discussed above. The matching network 54 is a quarter wave transform matching network that includes a diode 56 coupled to ground through a resistor 58. The resistor 58 is a current limiting resistor that limits the current through the diode 56. The diode 56 is also coupled to a DC bias port 60 between a matching section 62 and a quarter wavelength matching section 64. When a DC bias signal is applied to the port 60, the diode 56 conducts, creating an open circuit to RF. Therefore, an RF signal applied to an input port 66 sees an open circuit, and is prevented from propagating through the matching sections 62 and 64 to an output port 68. When no DC bias signal is applied to the port 60, the width and length of the section 62 and 64 determine the impedance of the network 54, which sets the impedance matching between the ports 66 and 68. Thus, by setting the RF signal propagation characteristics of the sections 62 and 64, the impedance of the matching network 54 can be provided. In one embodiment, the sections 62 and 64 are stepped sections that increase or decrease the impedance of the section with every step to provide the impedance matching.

The network 54 will be used in combination with another identical network 54 in each of the matching networks 28, 30 and 32. When a DC bias signal is applied to one port 60 of the networks 54, that network 54 will prevent the RF signal from propagating therethrough. The RF signal will propagate through the other network 54. Therefore, by selectively providing the impedance matching characteristics of the sections 62 and 64, the desired impedance matching can be provided by selecting which of the networks 54 the RF signals will propagate through. Thus, the DC bias signal is applied to one of the bias ports 60 when the amplifier 10 is in the transmit mode, and is applied to the other bias port 60 when the amplifier 10 is in the receive mode, so that the RF signal propagates through the matching network 54 that provides the desired impedance for the particular mode.

The foregoing discussion discloses and describes merely exemplary embodiments of the present invention. One skilled in the art will readily recognize from such discussion and from the accompanying drawings and claims, that various changes, modifications and variations can be made therein without departing from the spirit and scope of the invention as defined in the following claims.

What is claimed is:

1. A bi-directional amplifier for amplifying RF signals, said amplifier comprising:
    a first input port electrically coupled to one end of an RF transmission line;
    a second input port electrically coupled to an opposite end of the RF transmission line;
    at least one variable matching network electrically coupled to the transmission line between the first input port and the second input port;
    at least one amplifying device electrically coupled to the RF transmission line between the first input port and the second input port, wherein the at least one amplifying device amplifies an RF signal applied to either the first input port or the second input port, and wherein the variable matching network provides different impedance matching for the RF signal applied to the first port and the RF signal applied to the second port; and
    a bias device for providing a bias voltage to the at least one amplifying device, said bias device providing a different bias voltage to the RF signal applied to the first input port and the RF signal applied to the second input port.

2. The bi-directional amplifier according to claim 1 wherein the at least one amplifying device is a field effect transistor (FET).

3. The bi-directional amplifier according to claim 2 wherein a source terminal and a drain terminal of the FET are electrically coupled to the transmission line and a gate terminal of the FET is electrically coupled to ground.

4. The bi-directional amplifier according to claim 1 wherein the at least one amplifying device is a first amplifying device and a second amplifying device.

5. The bi-directional amplifier according to claim 4 wherein the at least one variable matching network is a first variable matching network electrically coupled to the transmission line between the first input port and the first amplifying device, a second variable matching network electrically coupled to the transmission line between the first amplifying device and the second amplifying device, and a third variable matching network electrically coupled to the transmission line between the second amplifying device and the second input port.

6. The bi-directional amplifier according to claim 1 wherein the at least one matching network includes a tunable capacitor and a tunable inductor.

7. The bi-directional amplifier according to claim 6 wherein the tunable capacitor and the tunable inductor both include a piezoelectric material that expands and contracts in response to a bias voltage to change the capacitance of the capacitor and the inductance of the inductor.

8. The bi-directional amplifier according to claim 1 wherein the at least one variable matching network includes at least one impedance matching section and a diode coupled to ground, wherein a bias voltage applied to the diode prevents the RF signal from propagating through the impedance matching section.

9. The bi-directional amplifier according to claim 8 wherein the impedance matching section is a quarter-wave section.

10. The bi-directional amplifier according to claim 8 wherein the at least one impedance matching section is two impedance matching sections wherein the bias voltage and the diode are coupled between the impedance matching sections.

11. The bi-directional amplifier according to claim 1 wherein the bias device is a DC voltage regulator, said DC voltage regulator providing a bias voltage to the at least one variable matching network.

12. A bi-directional amplifier for amplifying a transmit RF signal and a receive RF signal, said amplifier comprising:
    an RF transmission line;
    a transmit signal input port electrically coupled to one end of the transmission line;
    a receive signal input port electrically coupled to an opposite end of the transmission line;
    a first field effect transistor (FET) electrically coupled to the transmission line;

a second FET electrically coupled to the transmission line;

a first variable matching network electrically coupled to the transmission line between the transmit input port and the first FET;

a second variable matching network electrically coupled to the transmission line between the first FET and the second FET;

a third variable matching network electrically coupled to the transmission line between the second FET and the receive signal input port; and a DC voltage regulator electrically coupled to the first, second and third matching networks, said voltage regulator providing a control voltage to the first, second and third matching networks to selectively provide different impedance matching characteristics for the transmit RF signal and the receive RF signal, and wherein the voltage regulator provides different DC bias voltages to vary the gain of the first FET and the second FET for the transmit RF signal and the receive signal.

13. The bi-directional amplifier according to claim 12 wherein a source terminal and a drain terminal of the first FET and the second FET are electrically coupled to the transmission line and a gate terminal of the first FET and the second FET are coupled to ground.

14. The bi-directional amplifier according to claim 12 wherein at least one of the matching networks includes a tunable capacitor and a tunable inductor.

15. The bi-directional amplifier according to claim 14 wherein the tunable capacitor and the tunable inductor include a piezoelectric material that expands and contracts in response to the control voltage to change the capacitance of the capacitor and the inductance of the inductor.

16. The bi-directional amplifier according to claim 12 wherein at least one of the first, second and third variable matching networks includes at least one impedance matching section and a diode coupled to ground, wherein a bias voltage applied to the diode prevents the RF signal from propagating through the impedance matching section.

17. A bi-directional amplifier for amplifying an RF signal, said amplifier comprising:

a first input port electrically coupled to one end of an RF transmission line;

a second input port electrically coupled to an opposite end of the RF transmission line;

at least one amplifying device electrically coupled to the RF transmission line between the first input port and the second input port; and a DC voltage regulator providing a DC bias signal to the at least one amplifying device, said voltage regulator providing a different DC bias voltage to the amplifying device for an RF signal applied to the first input port and an RF signal applied to the second input port.

18. The bi-directional amplifier according to claim 17 wherein the at least one amplifying device is a first field effect transistor (FET) and a second FET.

19. The bi-directional amplifier according to claim 18 wherein the first and second FETs are common gate FETs.

20. The bi-directional amplifier according to claim 18 wherein a source terminal and a gate terminal of the first and second FETs are electrically coupled to the transmission line and a base terminal of the first and second FETs is electrically coupled to ground.

21. A method of amplifying an RF signal, comprising:

applying the RF signal to a first end of an RF transmission line or a second end of the RF transmission line;

propagating the RF signal through at least one variable matching network electrically coupled to the transmission line;

amplifying the RF signal by at least one amplifying device electrically coupled to the transmission line; and selectively providing different DC bias voltages to the at least one matching network and the at least one amplifying device to change the impedance matching characteristics of the matching network and the gain of the amplifying device depending on whether the RF signal is applied to the first or second end of the transmission line.

22. The method according to claim 21 wherein the at least one amplifying device is two common gate field effect transistors.

23. The method according to claim 21 wherein the at least one matching network is three matching networks and the at least one amplifying device is two amplifying devices, wherein a first matching network is provided between the first end of the transmission line and a first amplifying device, a second matching network is provided between the first amplifying device and a second amplifying device, and a third matching network is provided between the second amplifying device and the second end of the transmission line.

* * * * *